United States Patent
Liu et al.

(10) Patent No.: US 9,857,693 B1
(45) Date of Patent: Jan. 2, 2018

(54) LITHOGRAPHY MODEL CALIBRATION VIA CACHE-BASED NICHING GENETIC ALGORITHMS

(71) Applicant: Mentor Graphics Corporation, Wilsonville, OR (US)

(72) Inventors: Huikan Liu, Fremont, CA (US); Konstantinos Adam, Belmont, CA (US); Nicolas Bailey Cobb, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/401,078

(22) Filed: Jan. 8, 2017

(51) Int. Cl.
  G03B 27/42 (2006.01)
  G12B 13/00 (2006.01)
  G03F 7/20 (2006.01)

(52) U.S. Cl.
  CPC .............. G03F 7/70591 (2013.01)

(58) Field of Classification Search
  CPC ........ G03F 7/705; G03F 1/36; G03F 7/70441; G03F 7/70516; G03F 1/70; G03F 7/70625; G03F 1/144; G03F 7/70091; G03F 7/0002; G03F 7/70508; G03F 7/70616; G06F 17/5009; G06F 17/50
  See application file for complete search history.

(56) References Cited

U.S. PATENT DOCUMENTS

2016/0307790 A1* 10/2016 Sreenivasan ........ H01L 21/6875

OTHER PUBLICATIONS

N.N. Glibovets et al. "A review of niching genetic algorithms for multimodal function optimization," Cybernetics and Systems Analysis, vol. 49, No. 6, 2013.
Bruno Sareni et al. "Fitness sharing and niching methods revisited," IEEE Transactions of Evolutionary Computation, vol. 2, No. 3, 1998.
S. W. Mahfoud, "Niching methods for genetic algorithms," Ph.D. Dis., Univ. of Illinois at Urbana-Champaign, Illinois Genetic Algorithms Lab. (1995).
Chris Mack, "Improved methods for lithography model calibration," Proc. of SPIE, vol. 6607.

* cited by examiner

*Primary Examiner* — Mesfin Asfaw

(57) ABSTRACT

A set of original model candidates are first divided into groups of original model candidates. Child model candidates are generated by performing crossover on each of the groups of original model candidates without mutation. From the original model candidates and the child model candidates, a set of new model candidates are derived, which includes: selecting a group of new model candidates from each group of the original model candidates and the corresponding child model candidates, selecting an additional new model candidate if adding the additional new model candidate increases overall diversity, and performing niche clearing to keep a number of the new model candidates in each of niches from exceeding a maximum number. The dividing, generating and deriving operations are then iterated. Model caching may be performed by restricting the crossover to the model term level or above.

27 Claims, 10 Drawing Sheets

$$+ c_0 I + c_1 I_{\otimes BS} \otimes G_{S1} + c_2 I_{\otimes BS} \otimes G_{S1} + c_3 |\nabla I| \otimes G_{S4} + c_4 \sqrt{I_{\otimes BS}^2 \otimes G_{S5}} + c_5 \Delta I \otimes G_{S7}$$

$$+ c_6 I_{\otimes BS} \otimes G_{SS} + c_7 I_{\otimes BS} \otimes G_{SS} + c_8 I_{\otimes BS} \otimes G_{S10} + c_9 \sqrt{I_{\otimes BS}^2 \otimes G_{S11}}$$

$$\Biggr\} \text{ MF22}$$

doubled b-terms $$+ s_0 A_0 + s_1 L_0 + s_2 A_0 \times L_0 + s_3 A_1 + s_4 L_1 + s_5 A_1 \times L_1$$

dual polarity shrink $$+ c_{SE} * \left\{ \left( \sqrt{G^2 + (l_{min})^2} - |\nabla I| \right) \otimes G_{cl} \right\}$$

horizontal bias $$+ c_{SWB} * \left\{ \left( (l_c - l_b) - |\nabla I| \right) \otimes G_{SWB} \right\} = T$$

sidewall bias

FIG. 5

| 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| S1 | B1 | S2 | B2 | S3 | B3 | S4 | B4 | S5 | B5 | S6 | S7 | S8 | S9 | B9 |

| 15 | 16 | 17 | 18 | 19 | 20 | 21 | 22 | 23 | 24 | 25 | 26 | 27 | 28 | 29 |
|---|---|---|---|---|---|---|---|---|---|---|---|---|---|---|
| S10 | B10 | S11 | B11 | SHRINK_ RADIUS0 | SHRINK_ THRESH OLD0 | SHRINK_ RADIUS1 | SHRINK_ THRESH OLD1 | HBIAS_A | HBIAS_B | HBIAS_D | HBIAS_S_T | SWBIAS_ B | SWBIAS_ S_T | SWBIAS_ S_B |

FIG. 6

$$M(x, y) = H(x, y) \otimes G_d$$

$$H(x, y) = c * \sqrt{a^2 + (I_m(x,y))^2} * \sqrt{\left(\frac{\partial I(x,y)}{\partial x}\right)^2 + \left(\frac{\partial I(x,y)}{\partial y}\right)^2}$$

$$I_m(x, y) = \frac{1}{2*b} * \left(b^2 - \left((I_{-b})^2 \otimes G_s\right)(x, y)\right)$$

- a=0.01  # [0.001 1], threshold level related to 1/Rmax
- b=0.3   # [0.1 2.5], threshold level for Imin as in b-terms
- s=100   # [25 250], search range (nm) for Imin
- d=50    # [25 100], smoothing length (nm)

FIG. 7

LITHOGRAPHY MODEL CALIBRATION VIA CACHE-BASED NICHING GENETIC ALGORITHMS

FIELD OF THE DISCLOSED TECHNOLOGY

The present disclosed technology relates to the field of lithography. Various implementations of the disclosed technology may be particularly useful for calibrating lithography models.

BACKGROUND OF THE DISCLOSED TECHNOLOGY

Optical Proximity Correction (OPC) enables low-k1 lithography by changing the pattern shapes on the mask to correct for the non-linear process of printing those patterns on a wafer. OPC has continually improved in accuracy over the years by adding more physically based lithography models. Some other design and verification processes such as design for manufacture may also employ lithography models. Lithography models, including rigorous first principle models and fast approximate models, require calibration using measured data. The calibration of lithography models involves function evaluations and data fitting. There are two major concerns for the model calibration. First, the computational cost of function evaluations, especially for complex negative tone developer (NTD) resist models, is very high and dominates the calibration run time. Second, the fitting objective is a multi-modal function of the tuning parameters, and users are generally interested in models other than the model with the best fitting objective. As the model complexity increases, it is challenging to find a convergent solution.

BRIEF SUMMARY OF THE DISCLOSED TECHNOLOGY

Aspects of the disclosed technology relate to techniques for calibrating lithography models. In one aspect, there is a method comprising: dividing a set of original model candidates into groups of original model candidates, the original model candidates being derived based on a lithography model for a component of a lithographic process and having different sets of values of model parameters of the lithography model; generating child model candidates by performing crossover on each of the groups of original model candidates without mutation; deriving a set of new model candidates from the original model candidates and the child model candidates, wherein the deriving comprises: selecting a group of new model candidates from each of the groups of the original model candidates and the child model candidates for the each of the groups of original model candidates based on an objective function, the group of new model candidates having a size equal to that of the each of the groups of the original model candidates, further selecting, from the each of the groups of the original model candidates and the child model candidates for the each of the groups of original model candidates, an additional new model candidate based on the objective function if adding the additional new model candidate increases overall diversity based on a similarity function and a predetermined condition, and removing one or more new model candidates based on the objective function to keep a number of the new model candidates in each of niches from exceeding a maximum number, the niches being determined based on the similarity function; repeating the dividing, the generating and the deriving by replacing the set of original model candidates with the set of new model candidates until one of one or more predefined conditions is satisfied to obtain a set of final model candidates; and reporting one or more final model candidates in the set of final model candidates based on the objective function and the niches, from which one final model candidate is to be selected as a calibrated lithography model for simulating the lithographic process.

The crossover may be restricted at a level of model terms of the lithography model or a higher level. Values calculated for model terms for the set of original model candidates may be cached.

The crossover may employ a uniform crossover scheme. The set of original model candidates may be derived by choosing the values of the model parameters uniformly distributed within predetermined ranges for the model parameters per model term.

The similarity function may be a normalized Euclidian distance function. The objective function may be a root mean square function. The component of a lithographic process may be resist behavior in the lithographic process. The reporting may comprise storing, displaying or both.

According to some embodiments of the disclosed technology, each of the groups of original model candidates has two original model candidates. Additionally, the similarity function may be a normalized Euclidean distance function and the predetermined condition may be that a distance between the additional new model candidate and either of the group of new model candidates is greater than or equal to that between the group of new model candidates.

The removing may be performed to keep not only the number of the new model candidates in each of niches from exceeding the maximum number but also a total number of the new model candidates from exceeding a threshold number.

In another aspect, there are one or more non-transitory processor-readable media storing processor-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 5 illustrates an example of a resist model.

FIG. 6 illustrates model parameters for the resist model shown in FIG. 5.

FIG. 7 illustrates the horizontal bias term, a model term of the resist model shown in FIG. 5 and its model parameters.

DETAILED DESCRIPTION OF THE DISCLOSED TECHNOLOGY

General Considerations

Figure 1:
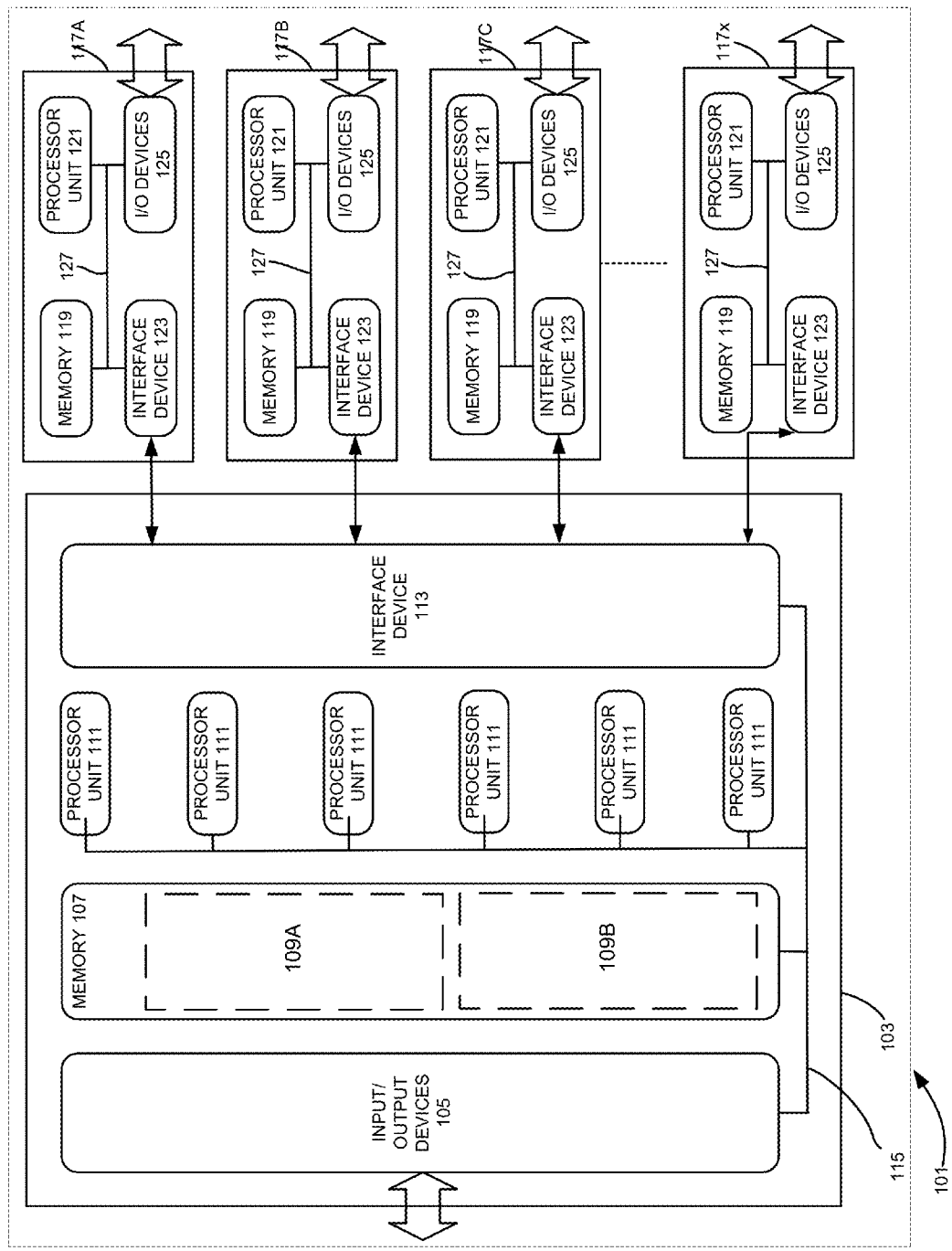
FIG. 1 illustrates an example of a computing system that may be used to implement various embodiments of the disclosed technology.

Various aspects of the disclosed technology relate to techniques for calibrating lithography models. In the following description, numerous details are set forth for the purpose of explanation. However, one of ordinary skill in the art will realize that the disclosed technology may be practiced without the use of these specific details. In other instances, well-known features have not been described in details to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate", "divide" and "derive" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of concurrently running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device.

For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
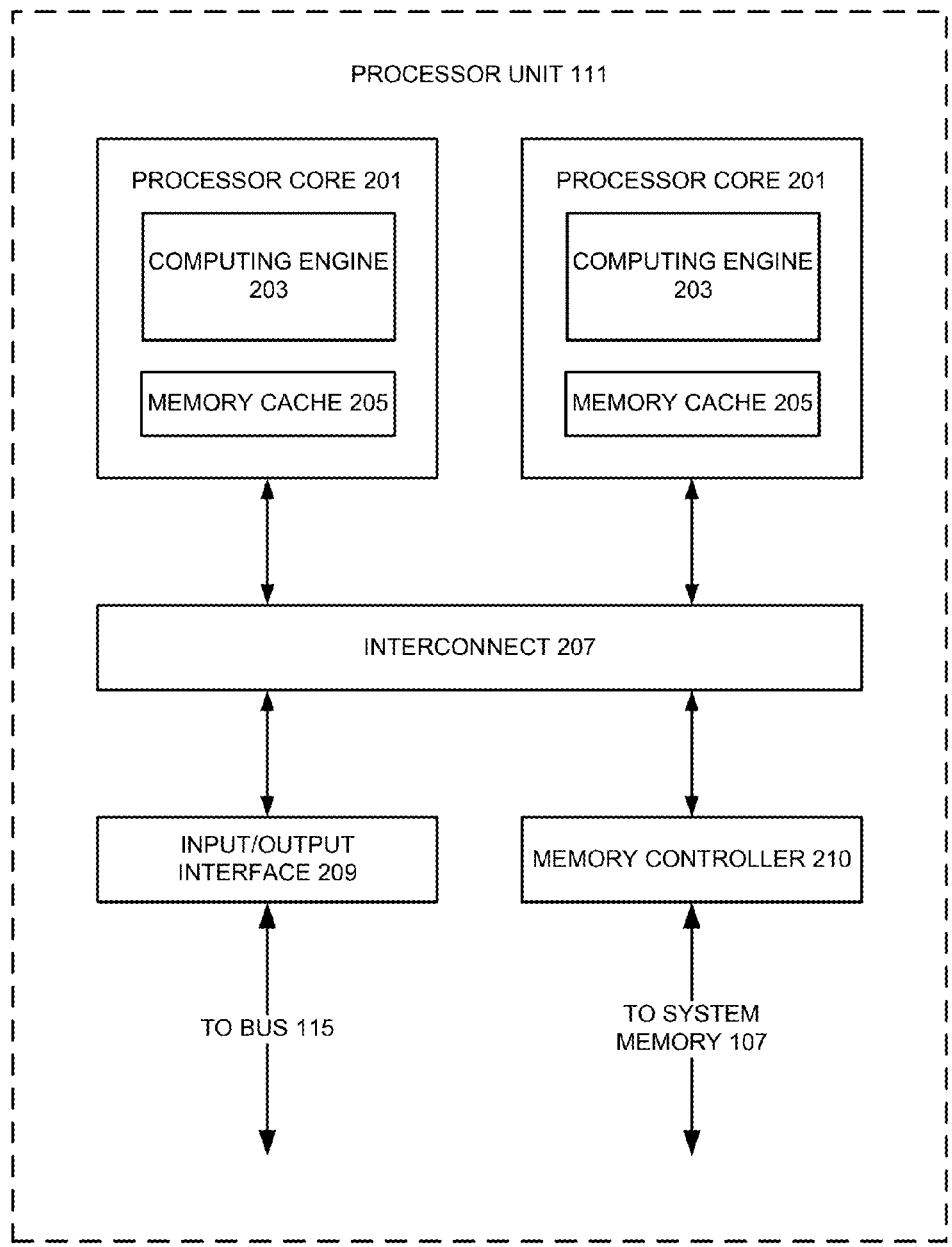
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EE- PROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Circuit Design, Verification and Manufacture

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, such as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask.

In a conventional OPC process, the edges of the geometric elements in the design are fragmented. The size of the edge fragments in a given layout design depends upon the OPC process parameters, often referred to as the OPC recipe. The "recipe" specifies the size of the edge fragments. While not all edges within a layout design are fragmented in every OPC process, these edges may also be referred to as edge fragments. In a model-based OPC process, the printed image is simulated. That is, the photolithographic process is simulated in order to produce a simulated printed image (referred to as simulated image). This simulated image is compared to the target image. The distances between the target image and the simulated image are often referred to as the edge placement error (EPE). Accordingly, in most conventional model-based OPC processes each edge fragment or unfragmented edge has an associated edge placement error (also referred to as an associated edge placement error value).

Next, the edge fragments are individually moved or adjusted in order to enable the simulated image for the resulting mask to reproduce the target image as much as possible. This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process.

The performance of an OPC process depends in part on the accuracy and predictability of lithography models that mathematically represent the distinct steps in the patterning sequence. These lithography models (sometimes also referred to as OPC models or lithographic process models) include optical models for aerial image formation and resist/etch process models for the photoresist-associated steps such as exposure, post-exposure bake, development, and pattern transfer. The optical models for full-chip simulation are usually quasi-rigorous. For example, the Hopkins optical model may be approximated by a sum of coherent systems approximation method, which is not a dramatic simplification. By contrast, the resist/etch process models tend to be semi-empirical: mathematical formulation is used to provide a transfer function between inputs and measured outputs of interest. Due to the semi-empirical nature, the resist/etch process models need to be calibrated based on measurements on printed wafers. The model parameters are trained or calibrated so that simulation data would fit measurement data. Even some parameters for the optical models such as dose and focus may also need to be calibrated against measurement data.

In a calibration process, the calibration of the optical model parameters may be performed first. With the optical model parameters thus set, a subsequent tuning of the resist model parameters is performed. Alternatively, the tuning of both the optical model parameters and the resist model parameters may be conducted simultaneously in a single lumped calibration process.

Genetic Algorithm

The genetic algorithm, as a major family in evolutionary algorithms, is inspired by the natural phenomenon of biological evolution. It relies on the principle of "survival of the fittest." A genetic algorithm process generally begins with a random population in which potential solutions are encoded into chromosomes. By evaluating each chromosome against the objective functions, its goodness, represented by a fitness value, can be determined. Based on the fitness value, some chromosomes are then selected to form a mating pool that will undergo genetic operations, namely, crossover and mutation, to produce some new solutions.

The chromosomes (called the parent chromosomes) in the mating pool exchange their genes to generate new chromosomes (called the child chromosomes) via crossover, while some genes are changed by a random process called mutation. These two operations keep the balance between the exploration and exploitation of solutions so that a genetic algorithm can generate better solutions based on acquired information and some random processes.

The newly formed chromosomes are then assessed by objective functions, and fitness values are assigned. Usually, fitter child chromosomes will replace some or all of the parent chromosomes such that a new population is obtained. This genetic cycle is repeated until some criteria are met.

As a population-based optimization algorithm, the genetic algorithm can linearly reduce runtime of evaluating the objective functions by executing the evaluations in parallel. The parallelization of function evaluation can be easily implemented as it requires minimal synchronization.

Niching genetic algorithms offers an efficient way to search for multiple optima of a multimodal function by promoting the formation of stable subpopulations in the search space. It is based on the phenomenon of separation and specialization in natural ecosystems. In ecology, a niche is associated with a complex of specific living conditions, a subset of environmental resources, and a species is a set of individuals consuming the resources of a specific niche. Thus, niches are a part of the environment and species are a part of the set of all possible individuals. By analogy, in genetic algorithms the term niche is used for the search space domain, and species for the set of individuals with similar characteristics.

In niching genetic algorithms, individuals of a population are divided into several subpopulations-species, each of which occupies its niche, is related to it during the run of the algorithm, and specializes on the solution of a certain sub-problem of the original problem (searches for the optimum in the niche). Such an approach preserves the variety of individuals in the population and allows the genetic algorithm to analyze several optima simultaneously. To attain this effect, the process of selection of individuals usually takes into account not only the value of the fitness function but also the distribution of individuals in the space of genotypes or phenotypes.

Lithography Model Calibration Tools

Figure 3:
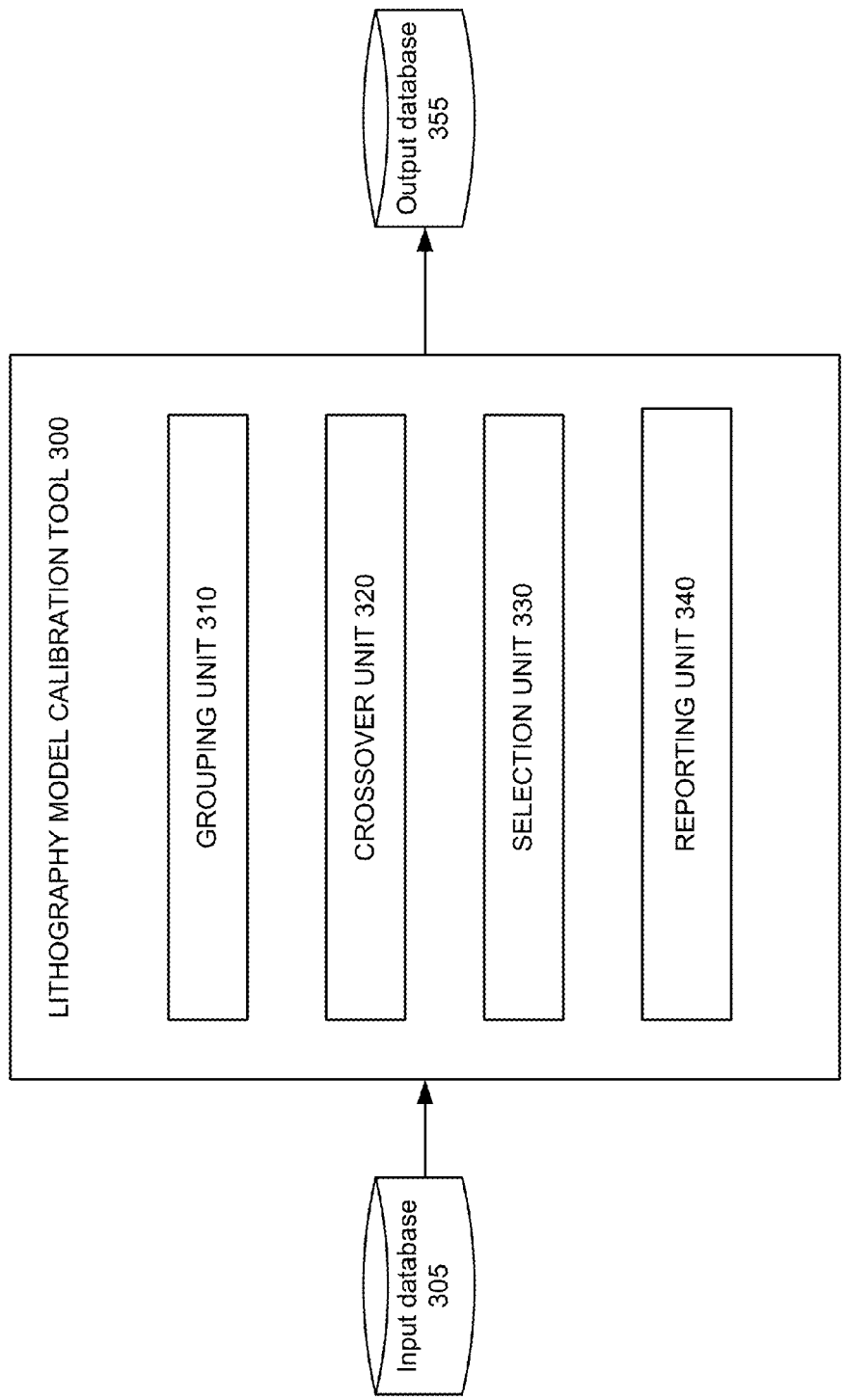
FIG. 3 illustrates an example of a lithography model calibration tool according to various embodiments of the disclosed technology.

FIG. 3 illustrates an example of a lithography model calibration tool 300 to perform lithography model calibration that may be implemented according to various embodiments of the disclosed technology. As seen in this figure, the lithography model calibration tool 300 includes a grouping unit 310, a crossover unit 320, a selection unit 330 and a reporting unit 340. Some implementations of the lithography model calibration tool 300 may cooperate with (or incorporate) one or more of an input database 305 and an output database 355.

As will be discussed in more detail below, the lithography model calibration tool 300 can receive a set of original model candidates from the input database 305. The original model candidate models a component of a lithographic process. The component may be the optical component, the resist component, or the etch component. The set of original model candidates are derived based on a lithography model modeling a component of a lithographic process but have different sets of values of model parameters of the lithography model. The grouping unit 310 can divide the set of original model candidates into groups of original model candidates. The crossover unit 320 can generate child model candidates by performing crossover on each of the groups of original model candidates without mutation. The selection unit 330 can derive a set of new model candidates from the original model candidates and the child model candidates. The lithography model calibration tool 300 can repeat the dividing, generating and deriving operations by replacing the set of original model candidates with the set of new model candidates until one of one or more predefined conditions is satisfied to obtain a set of final model candidates. The reporting unit 340 can report one or more final model candidates in the set of final model candidates based on the objective function and niches. Among the one or more final model candidates, one final model candidate may be selected for simulating the lithographic process. The reporting may comprise storing in the output database 355 and/or displaying by a graph unit (not shown in the figure), the one or more final model candidates.

As previously noted, various examples of the disclosed technology may be implemented by one or more computing systems, such as the computing system illustrated in FIGS. 1 and 2. Accordingly, one or more of the grouping unit 310, the crossover unit 320, the selection unit 330 and the reporting unit 340 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the grouping unit 310, the crossover unit 320, the selection unit 330 and the reporting unit 340. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the grouping unit 310, the crossover unit 320, the selection unit 330 and the reporting unit 340 are shown as separate units in FIG. 3, a single computer (or a single processor within a master computer) or a single computer system may be used to implement all of these units at different times, or components of these units at different times.

With various examples of the disclosed technology, the input database 305 and the output database 355 may be implemented using any suitable computer readable storage device. That is, either of the input database 305 and the output database 355 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 355 are shown as separate units in FIG. 3, a single data storage medium may be used to implement some or all of these databases.

Lithography Model Calibration

Figure 4:
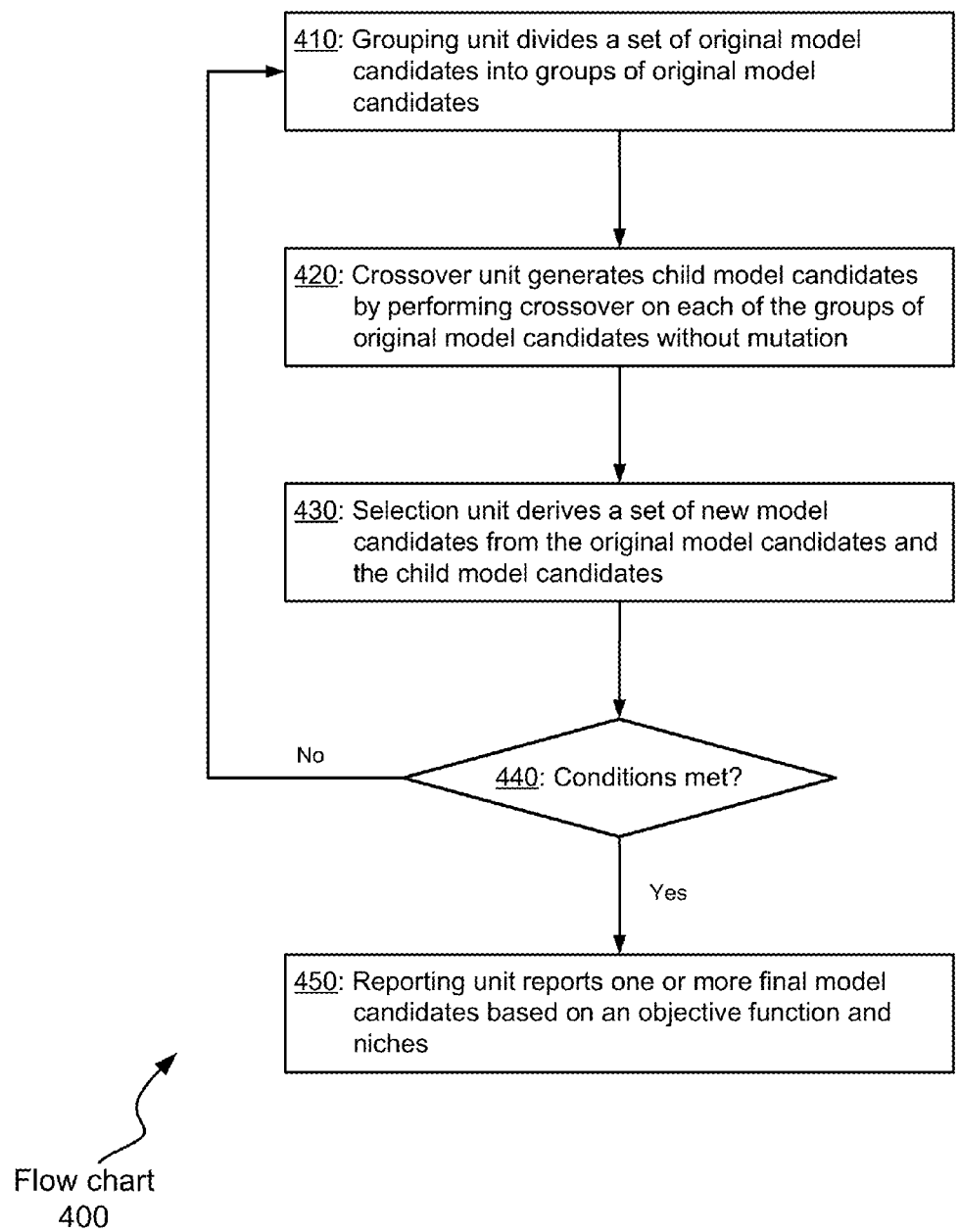
FIG. 4 illustrates a flowchart showing a process for calibrating lithography models that may be implemented according to various examples of the disclosed technology.

FIG. 4 illustrates a flowchart showing a process for lithography model calibration that may be implemented according to various examples of the disclosed technology. For ease of understanding, methods of lithography model calibration that may be employed according to various embodiments of the disclosed technology will be described with reference to the lithography model calibration tool 300 illustrated in FIG. 3 and the flow chart 400 in FIG. 4. It should be appreciated, however, that alternate implementations of a lithography model calibration tool may be used to perform the method of lithography model calibration shown in the flow chart 400 according to various embodiments of the disclosed technology. In addition, it should be appreciated that implementations of the lithography model calibration tool 300 may be employed to implement methods of lithography model calibration according to different embodiments of the disclosed technology other than the one illustrated by the flow chart 400 in FIG. 4.

Initially, in operation 410 of the flow chart 400, the grouping unit 310 divides a set of original model candidates into groups of original model candidates. The original model candidates are derived based on a lithography model for a component of a lithographic process. The lithography model may be an optical model, a mask model, a resist model or a topographical model. The lithography model includes model terms. Each of the model terms is associated with a mathematical term in a function form of the lithography model. Some or all of the model terms may correspond to physical/chemical processes/phenomena. A model term may have one or more model parameters. The set of original model candidates are derived based on the lithography model and have different sets of values of model parameters of the lithography model.

FIG. 5 illustrates an example of a resist model. The basics of the resist model have been discussed in an article authored by Granik, Y. et al., entitled "Towards standard process models for OPC," Proc. of SPIE Vol. 6520 (2007), which is incorporated herein by reference. The resist model shown in the figure is formed with a linear combination of modeling terms. These modeling terms can be divided into five groups: MF22, doubled b-terms, dual polarity shrink, horizontal bias, and sidewall bias, as shown in the figure. Each of the modeling terms has one or more model parameters. FIG. 6 illustrates the model parameters for the resist model shown in FIG. 5. In the figure, the index i of Si and Bi corresponds to the index for the first eleven modeling terms of the resist model (i.e., MF22+double b-terms). There are nineteen model parameters (0-18) in total for these eleven modeling terms. Among the rest of the modeling terms, the dual polarity shrink modeling terms have four model parameters (19-22), the horizontal bias term has four model parameters (23-26), and the sidewall bias term has three model parameters (27-29). Once the model parameters are determined, the linear parameters $c_i$, $s_i$, $c_{HB}$ and $c_{swb}$ shown in FIG. 5 can be derived by a model fitting process.

The horizontal bias term has been discussed in U.S. patent application Ser. No. 14/493,073, entitled "Horizontal development bias in negative tone development of photoresist," naming Deng, Yunfei et al. as inventors, which is incorporated herein by reference. FIG. 7 illustrates the horizontal bias term M(x, y) (the horizontal bias function before the Gauss-Laguerre convolution H(x, y)), the local minimal light intensity function $I_m(x, y)$, and the four model parameters (a, b, s and d) and their value ranges.

As noted previously, the set of original model candidates have different sets of values of the model parameters. For example, one original model candidate may have a set of the model parameter values including a=0.01, b=0.3, s=100 and d=50, while another original model candidate may have a set of the model parameter values including a=0.8, b=0.3, s=100 and d=75. Still another one may share the same values for the model parameters of the horizontal bias term with the former but has different values for at least one other model parameter (e.g., S5 for the fifth modeling term in MF22 shown in FIGS. 5 and 6).

Figure 8:
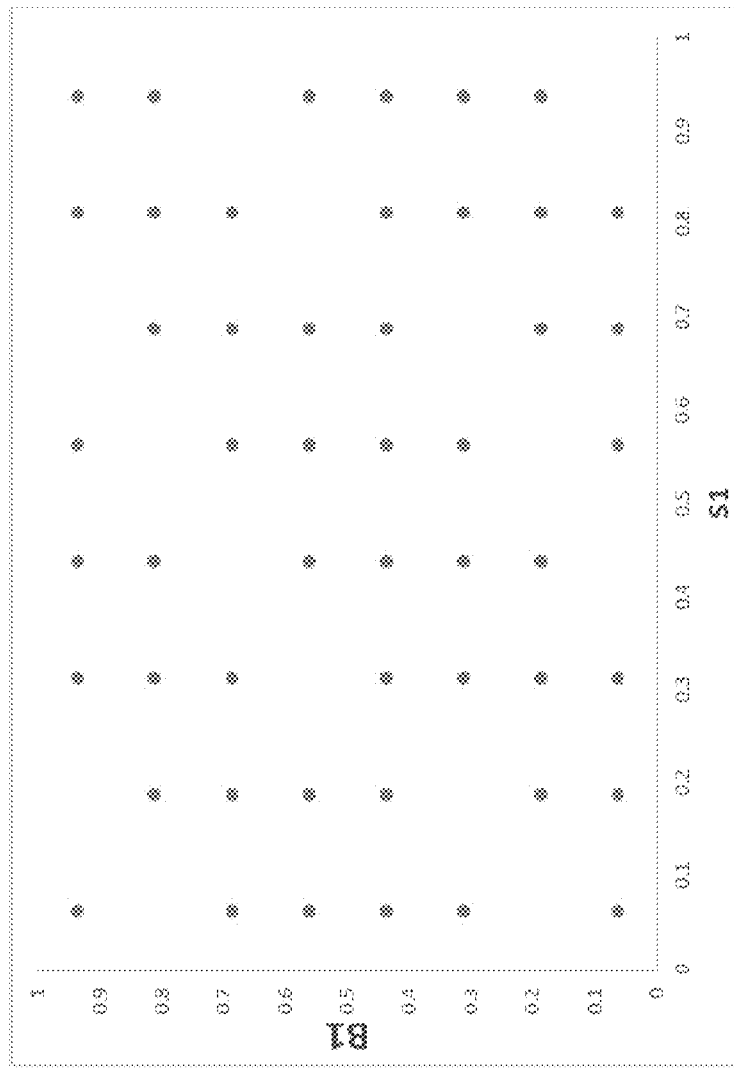
FIG. 8 illustrates an example of sampling parameter values for S1 and B1 (parameters for the first model term of the resist model shown in FIG. 5) for the set of original model candidates.

The lithography model calibration tool 300 may receive the set of original model candidates from the input database 305. The set of original model candidates may be derived by choosing the values of the model parameters uniformly distributed within predetermined ranges for the model parameters. FIG. 8 illustrates an example of sampling parameter values for S1 and B1 (parameters for the first model term of MF22 in FIGS. 5 and 6 for the set of original model candidates. Model terms that have a smaller number of parameters such as the diffusion terms may get denser sampling, while model terms that have more parameters such as the horizontal bias term may get sparser sampling. Alternatively, model candidates derived using different sampling processes or based on users' experience may be included in the set of original model candidates.

Using the same set of original model candidates, the disclosed model calibration process can lead to the same calibration result, which is preferred in some circumstances.

The grouping unit 310 may divide the original model candidates into groups randomly. An alternative way for grouping is based on genome similarity. For example, a normalized Euclidian distance function may be used to measure the similarity of genomes (model candidates):

$$d_{ij} = \sqrt{\frac{1}{N}\sum_{k=0}^{N-1}\frac{(g_k^i - g_k^j)^2}{(u_k - l_k)^2}} \quad (1)$$

where $G_i=(g_0^i, g_1^i, g_2^i, \ldots, g_{N-1}^i)$ and $G_j=(g_0^j, g_1^j, g_2^j, \ldots, g_{N-1}^j)$ are two 1D real number array genomes. Each gene $g_k^i$ is bounded by the range $l_k \leq g_k^i \leq u_k$. So $d_{ij}$ represents the distance (or similarity) between the genome $G_i$ and the genome $G_j$.

In some embodiments of the disclosed technology, the grouping unit 310 may divide the original model candidates into pairs. That is, each of the groups of the original model candidates has two members.

In operation 420, the crossover unit 320 generates child model candidates by performing crossover on each of the groups of original model candidates. With various implementations of the disclosed technology, mutation is disabled and only crossover is allowed to generate child model candidates.

Figure 9A:
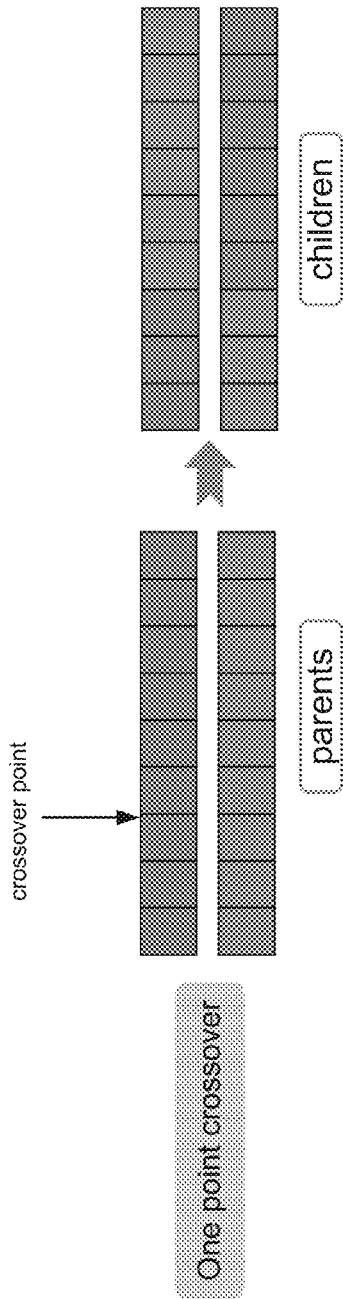
FIG. 9A illustrates an example of a single-point crossover technique.
Figure 9B:
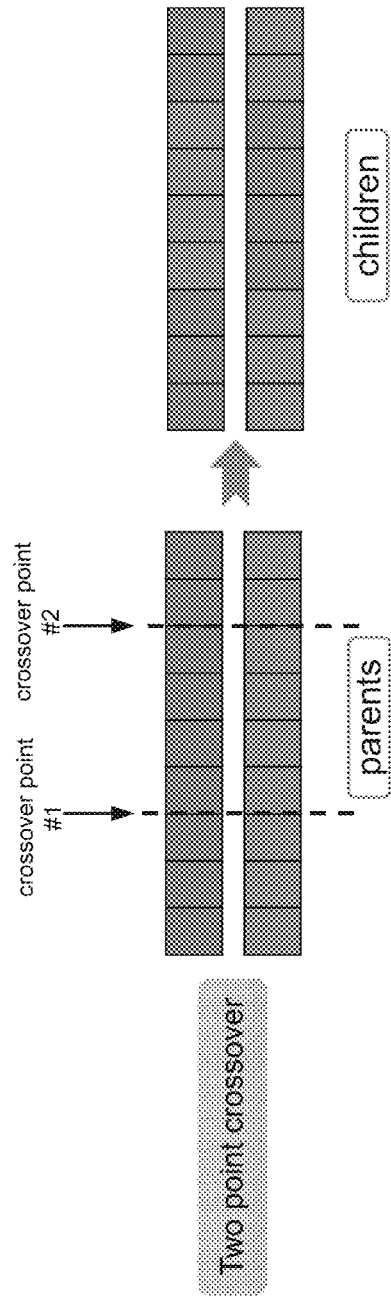
FIG. 9B an example of a two-point crossover technique.

A variety of crossover techniques can be employed by the crossover unit 320. The single-point crossover technique selects one crossover point on two parents. All model parameter values beyond that point in either parent are swapped between the two parents as illustrated in FIG. 9A. The two-point crossover technique calls for two points to be selected on the parents. Everything between the two points is swapped between the parents, rendering two children, as shown in FIG. 9B.

Figure 9C:
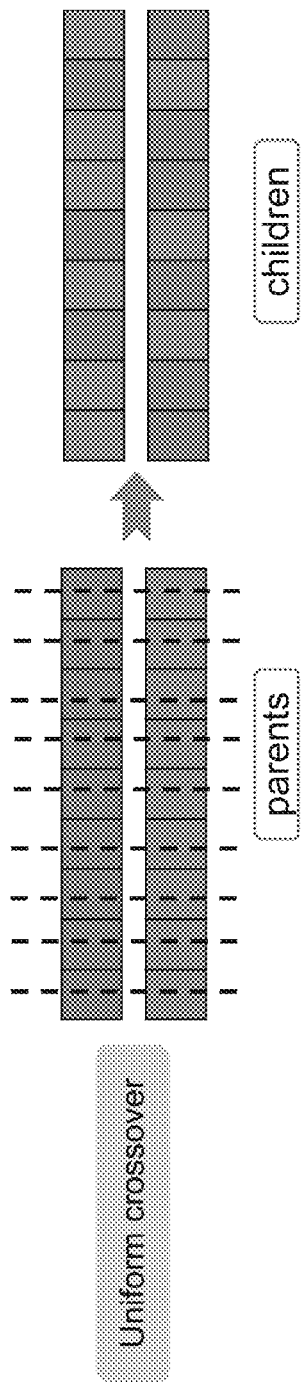
FIG. 9C illustrates an example of a uniform crossover technique.

The uniform crossover technique uses a fixed mixing ratio between two parents. Unlike single- and two-point crossover, the uniform crossover technique can allow the parents to contribute at the model parameter level rather than at the segment level, as shown in FIG. 9C. A uniform crossover operation uses a fixed mixing ratio between two parents. If the mixing ratio is 0.5, the offspring has approximately half of the genes from first parent and the other half from second parent.

Figure 9D:
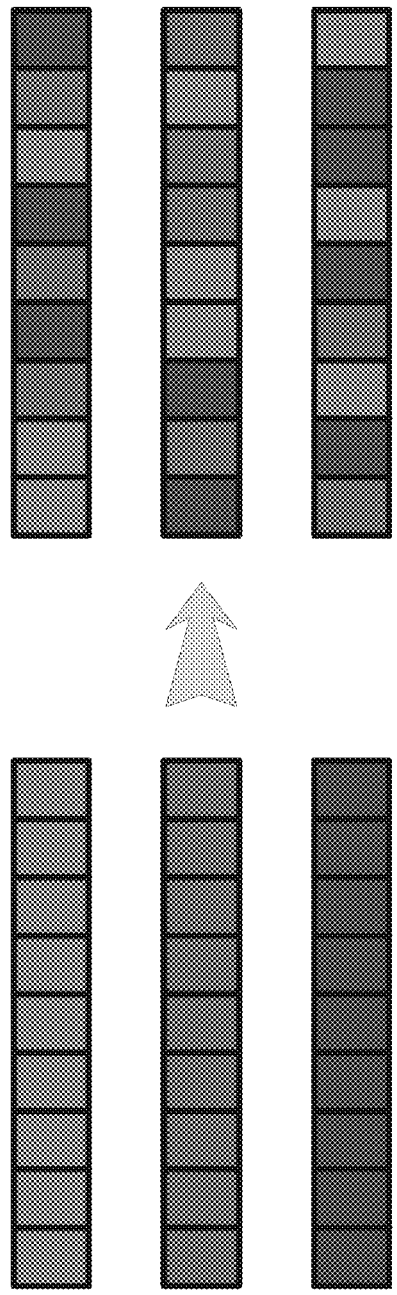
FIG. 9D illustrates an example of a three-parent crossover technique.

FIG. 9D illustrates an example of a three-parent crossover technique. In this technique, three children are derived from three parents. The possibility of a bit of a parent is used by a corresponding bit of a particular child is one third while each bit of a parent must be used by one and only one of the three children. Each bit of the first parent is compared with the same bit of the second parent. The illustrated three-parent crossover technique is also a uniform crossover technique.

An arithmetic crossover technique generates child genomes based on a random float number r. Assume that a parent pair is represented by $D=(d_0, d_1, d_2, \ldots, d_{L-1})$, $M=(m_0, m_1, m_2, \ldots, m_{L-1})$, and that the child pair is represented by $S=(s_0, s_1, s_2, \ldots, s_{L-1})$, $B=(b_0, b_1, b_2, \ldots, b_{L-1})$. The relationship between the parent and child pairs are: $b_i \leftarrow rd_i+(1-r)m_i$; $s_i \leftarrow rm_i+(1-r)d_i$; or $\{b_i \leftarrow rm_i+(1-r)d_i; s_i \leftarrow rd_i+(1-r)m_i$ depending on a random bit.

In some embodiments of the disclosed technology, the crossover unit 320 restricted the crossover to the model term level or the above, which is higher than the model parameter level. Accordingly, the model parameters belonging to the same model terms either all will be exchanged or none will be exchanged. The arrows shown in FIG. 6 indicate the boundaries between model parameters associated with the model terms of the resist model and thus allowable crossover points.

The operation 420 being restricted to crossover at the model term level or above enables a use of model cache. This is particularly useful for calibrating some lithography models such as the resist model shown in FIG. 5 and a topographical model discussed in U.S. Pat. No. 8,799,832, entitled "Optical Proximity correction for topographically non-uniform substrates," naming Granik, Yuri et al. as inventors, which is incorporated herein by reference. These two models both can be represented by a linear combination of model terms. The evaluation of the model candidates, i.e., comparing values calculated using the model candidates with measured values or values computed using a more accurate model, includes model term calculation and model fitting for deriving linear parameter values for this type of lithography models. In the resist model, for example, the model term calculation is a non-linear operation of aerial image intensity which is unchanged during the resist model calibration. As such, each model terms can be calculated only once and cached for all sampling values of the model parameters. The use of model cache thus can significantly reduce function evaluation time and speed up the whole model calibration process.

Figure 10:
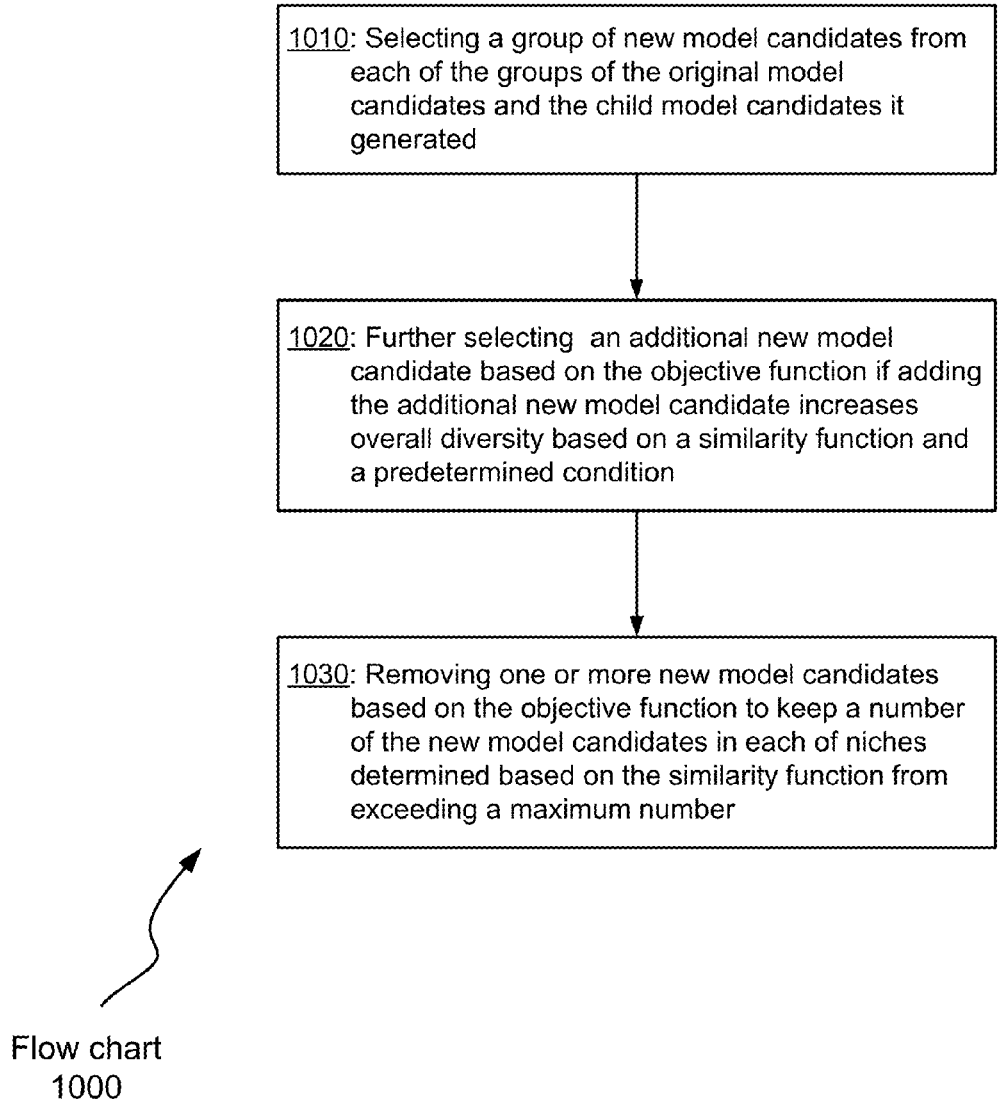
FIG. 10 illustrates a flowchart showing a detailed process for the derivation operation in the flow chart 400 (the operation 430) that may be implemented according to various examples of the disclosed technology.

In operation 430, the selection unit 330 derives a set of new model candidates from the original model candidates and the child model candidates. FIG. 10 illustrates a flowchart showing a detailed process for the operation 430 that may be implemented according to various examples of the disclosed technology. In operation 1010 of the flowchart 1000, a group of new model candidates is selected from each of the groups of the original model candidates and the child model candidates for the each of the groups of original model candidates based on an objective function. The group of new model candidates has a size equal to that of the each group of the original model candidates.

The objective function measures goodness or fitness of the original/child model candidates by comparing values calculated using the model candidates with measured values. The objective function may, for example, calculate a sum of squared errors or may be a root mean square function. The original/child model candidates have smaller values of the objective function are selected.

In operation 1020 of the flowchart 1000, an additional new model candidate is selected based on the objective function if adding the additional new model candidate increases overall diversity based on a similarity function and a predetermined condition. As noted previously, the similarity function may be a normalized Euclidian distance function. This may prevent good model candidates from being eliminated and reduce chances of pre-mature convergence. Typically, the additional new model candidate has a value of the objective function not smaller than those for the set of new model candidates but not bigger than those for the unselected original/child model candidates. In another word, it is ranked right after the group of new model candidates based on the objective function.

In operation 1030 of the flowchart 1000, one or more new model candidates are removed based on the objective function to keep a number of the new model candidates in each of niches determined based on the similarity function from exceeding a maximum number. This is a niche clearing technique. In general, clearing is based on the concept of limited resources in the environment and the necessity of sharing them among all individuals of the subpopulation but provides them only to the best representatives. In the present case of lithography model calibration, the niche clearing performed by the operation 1030 can help to prevent a few model candidates from dominating the entire population along with the operation 1020.

Additionally, one or more new model candidates may be removed based on the objective function to keep the total number of the new model candidates from exceeding a threshold number.

Niches may be defined using niche radius. The new model candidates that have a distance from a certain point equal to or smaller than the niche radius may be defined as a niche. That certain point may be set as the new model candidate that has the smallest value of the objective function. The niche radius may be predefined by users or set to be a default number.

With some implementations of the disclosed technology in which each of the groups of original model candidates has two original model candidates and two child model candidates are generated by the operation 420, the operation 430 may be performed as follows: The parents genomes are assumed to be $p_1$ and $p_2$, and their corresponding child genomes $c_1$ and $c_2$; sort the genomes in the group $\{p_1, p_2, c_1, c_2\}$ by values of the objective function from best to worst, marked as $\{b_1, b_2, b_3, b_4\}$; if $Dist(b_1, b_2) \leq Dist(b_1, b_3)$ and $Dist(b_1, b_2) \leq Dist(b_2, b_3)$, then select $b_1$, $b_2$ and $b_3$ as new model candidates; otherwise, select $b_1$ and $b_2$ as new model candidates. Here, $Dist(b_i, b_j)$ represents the distance between $b_i$ and $b_j$ calculated according to Eq. (1). The predetermined condition include the above two inequalities, which ensures that the third best genome will be selected if the addition increases the overall diversity.

In operation 440 of the flow chart 400, the lithography model calibration tool 300 decides whether one or more predefined conditions are satisfied. If none of the one or more predefined conditions is satisfied, the operations 410-430 are repeated by replacing the set of original model candidates with the set of new model candidates. The one or more predefined conditions may be total number of generations, total run time, convergence of diversity (the diversity of the entire population becomes lower than a certain threshold value), convergence of objective function values (the objective function values of the genomes in all of the niches stop improving for a certain number of generations), or any combination thereof.

To evaluate the fitness/goodness of a model candidate, the value of the objective function for the model candidate needs to be calculated, which may require computing the values of the lithography model for a number of points. If the crossover is restricted to the model term level or above, the runtime can be reduced significantly by the use of model cache as discussed previously. The exchanging takes place only between groups of the model parameters of the original model candidates, each of the groups of the model parameters belonging to one or more of model terms of the lithography model. As such, the time-consuming model term evaluations are done in the first iteration and fully cached given enough caching memory size. No new combinations of parameter values will be generated for the model terms in the subsequent iterations and the cached results will be used for evaluating later generations.

If one of the one or more predefined conditions is satisfied, the process moves to operation 450. In the operation, the reporting unit 340 reports one or more final model candidates in the set of final model candidates based on the objective function and the niches. No two final model candidates in the one or more final model candidates belonging one of the niches. For example, the reporting unit 340 may select the fittest final model candidate in each of the top five niches for the reporting. The reporting may comprises storing the one or more final model candidates in the output database 355 and/or displaying them on a display unit. Users may analyze the one or more final model candidates and select one as a calibrated lithography model for their lithographic processes. The calibrated lithography model can be used by OPC and/or other design and layout verification techniques.

The disclosed technology improves lithography model calibration, a computer-related technology by offering high scalability for parallelization of function evaluation) and capabilities of caching, specifying multiple starting points, increasing population diversity and avoiding pre-mature convergence. Experimental results have shown that a lithography model calibrated using an embodiment of the disclosed technology can readily identity multiple different global optima while a traditional approach always converges to 1 particular global optima and that each of the multiple global optima has a higher fitness than the particular global optima. Moreover, the disclosed technology can achieve significant runtime reduction without sacrificing the quality of the result.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while a particular resist model has been employed above to illustrate how the disclosed technology may be implemented, it should be appreciated that various examples of the disclosed technology may be implemented to calibrate other lithography models such as a topographic model for modeling physical effects related to non-uniform wafer topography.

What is claimed is:

1. A method, executed by at least one processor of a computer, comprising:
dividing a set of original model candidates into groups of original model candidates, the original model candidates being derived based on a lithography model for a component of a lithographic process and having different sets of values of model parameters of the lithography model;
generating child model candidates by performing crossover on each of the groups of original model candidates without mutation;
deriving a set of new model candidates from the original model candidates and the child model candidates, wherein the deriving comprises:
selecting a group of new model candidates from each of the groups of the original model candidates and the child model candidates for the each of the groups of original model candidates based on an objective function, the group of new model candidates having a size equal to that of the each of the groups of the original model candidates,
further selecting, from the each of the groups of the original model candidates and the child model candidates for the each of the groups of original model candidates, an additional new model candidate based on the objective function if adding the additional new model candidate increases overall diversity based on a similarity function and a predetermined condition, and
removing one or more new model candidates based on the objective function to keep a number of the new model candidates in each of niches from exceeding a maximum number, the niches being determined based on the similarity function;
repeating the dividing, the generating and the deriving by replacing the set of original model candidates with the set of new model candidates until one of one or more predefined conditions is satisfied to obtain a set of final model candidates; and
reporting one or more final model candidates in the set of final model candidates based on the objective function and the niches, from which one final model candidate is to be selected as a calibrated lithography model for simulating the lithographic process.

2. The method recited in claim 1, wherein the crossover is at a level of model terms of the lithography model or a higher level.

3. The method recited in claim 2, further comprising:
caching values calculated for model terms for the set of original model candidates.

4. The method recited in claim 1, wherein the crossover employs a uniform crossover scheme.

5. The method recited in claim 1, wherein the set of original model candidates is derived by choosing the values of the model parameters uniformly distributed within predetermined ranges for the model parameters per model term.

6. The method recited in claim 1, wherein the similarity function is a normalized Euclidian distance function.

7. The method recited in claim 1, wherein the objective function is a root mean square function.

8. The method recited in claim 1, wherein the component of a lithographic process is resist behavior in the lithographic process.

9. The method recited in claim 1, wherein each of the groups of original model candidates has two original model candidates.

10. The method recited in claim 1, wherein each of the groups of original model candidates has two original model candidates, the similarity function is a normalized Euclidian distance function and the predetermined condition is that a distance between the additional new model candidate and either of the group of new model candidates is greater than or equal to that between the group of new model candidates.

11. The method recited in claim 1, wherein the removing is performed to keep not only the number of the new model candidates in each of niches from exceeding the maximum number but also a total number of the new model candidates from exceeding a threshold number.

12. The method recited in claim 1, wherein the reporting comprises storing, displaying or both.

13. One or more non-transitory processor-readable media storing processor-executable instructions for causing one or more processors to perform a method, the method comprising:
dividing a set of original model candidates into groups of original model candidates, the original model candidates being derived based on a lithography model for a component of a lithographic process and having different sets of values of model parameters of the lithography model;
generating child model candidates by performing crossover on each of the groups of original model candidates without mutation;
deriving a set of new model candidates from the original model candidates and the child model candidates, wherein the deriving comprises:
selecting a group of new model candidates from each of the groups of the original model candidates and the child model candidates for the each of the groups of original model candidates based on an objective function, the group of new model candidates having a size equal to that of the each of the groups of the original model candidates,
further selecting, from the each of the groups of the original model candidates and the child model candidates for the each of the groups of original model candidates, an additional new model candidate based on the objective function if adding the additional new model candidate increases overall diversity based on a similarity function and a predetermined condition, and
removing one or more new model candidates based on the objective function to keep a number of the new model candidates in each of niches from exceeding a maximum number, the niches being determined based on the similarity function;
repeating the dividing, the generating and the deriving by replacing the set of original model candidates with the set of new model candidates until one of one or more predefined conditions is satisfied to obtain a set of final model candidates; and reporting one or more final model candidates in the set of final model candidates based on the objective function and the niches, from which one final model candidate is to be selected as a calibrated lithography model for simulating the lithographic process.

14. The one or more non-transitory processor-readable media recited in claim 13, wherein the crossover is at a level of model terms of the lithography model or a higher level.

15. The one or more non-transitory processor-readable media recited in claim 14, wherein the method further comprises:
caching values calculated for model terms for the set of original model candidates.

16. The one or more non-transitory processor-readable media recited in claim 13, wherein the crossover employs a uniform crossover scheme.

17. The one or more non-transitory processor-readable media recited in claim 13, wherein the set of original model candidates is derived by choosing the values of the model parameters uniformly distributed within predetermined ranges for the model parameters per model term.

18. The one or more non-transitory processor-readable media recited in claim 13, wherein the similarity function is a normalized Euclidian distance function.

19. The one or more non-transitory processor-readable media recited in claim 13, wherein the objective function is a root mean square function.

20. The one or more non-transitory processor-readable media recited in claim 13, wherein the component of a lithographic process is resist behavior in the lithographic process.

21. The one or more non-transitory processor-readable media recited in claim 13, wherein each of the groups of original model candidates has two original model candidates.

22. The one or more non-transitory processor-readable media recited in claim 13, wherein each of the groups of original model candidates has two original model candidates, the similarity function is a normalized Euclidian distance function and the predetermined condition is that a distance between the additional new model candidate and either of the group of new model candidates is greater than or equal to that between the group of new model candidates.

23. The one or more non-transitory processor-readable media recited in claim 13, wherein the removing is performed to keep not only the number of the new model candidates in each of niches from exceeding the maximum number but also a total number of the new model candidates from exceeding a threshold number.

24. The one or more non-transitory processor-readable media recited in claim 13, wherein the reporting comprises storing, displaying or both.

25. A system, comprising:
one or more processors, the one or more processors programmed to perform a method, the method comprising:
dividing a set of original model candidates into groups of original model candidates, the original model candidates being derived based on a lithography model for a component of a lithographic process and having different sets of values of model parameters of the lithography model;
generating child model candidates by performing crossover on each of the groups of original model candidates without mutation;
deriving a set of new model candidates from the original model candidates and the child model candidates, wherein the deriving comprises:
selecting a group of new model candidates from each of the groups of the original model candidates and the child model candidates for the each of the groups of original model candidates based on an objective function, the group of new model candidates having a size equal to that of the each of the groups of the original model candidates,
further selecting, from the each of the groups of the original model candidates and the child model candidates for the each of the groups of original model candidates, an additional new model candidate based on the objective function if adding the additional new model candidate increases overall diversity based on a similarity function and a predetermined condition, and
removing one or more new model candidates based on the objective function to keep a number of the new model candidates in each of niches from exceeding a maximum number, the niches being determined based on the similarity function;
repeating the dividing, the generating and the deriving by replacing the set of original model candidates with the set of new model candidates until one of one or more predefined conditions is satisfied to obtain a set of final model candidates; and
reporting one or more final model candidates in the set of final model candidates based on the objective function and the niches, from which one final model candidate is to be selected as a calibrated lithography model for simulating the lithographic process.

26. The system recited in claim 25, wherein the crossover is at a level of model terms of the lithography model or a higher level.

27. The system recited in claim 26, wherein the method further comprises:
caching values calculated for model terms for the set of original model candidates.

* * * * *